(12) United States Patent
Wang et al.

(10) Patent No.: US 10,868,118 B2
(45) Date of Patent: Dec. 15, 2020

(54) METHODS OF FORMING EPITAXIAL SOURCE/DRAIN FEATURES IN SEMICONDUCTOR DEVICES

(71) Applicant: Taiwan Semiconductor Manufacturing Co., Ltd., Hsin-Chu (TW)

(72) Inventors: Jia-Heng Wang, Kaohsiung (TW); I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/409,453

(22) Filed: May 10, 2019

(65) Prior Publication Data

US 2020/0075724 A1 Mar. 5, 2020

Related U.S. Application Data

(60) Provisional application No. 62/725,462, filed on Aug. 31, 2018.

(51) Int. Cl.
*H01L 29/417* (2006.01)
*H01L 29/08* (2006.01)
(Continued)

(52) U.S. Cl.
CPC .... *H01L 29/0847* (2013.01); *H01L 21/02236* (2013.01); *H01L 21/2253* (2013.01); *H01L 21/268* (2013.01); *H01L 21/31111* (2013.01); *H01L 21/31116* (2013.01); *H01L 29/401* (2013.01); *H01L 29/41791* (2013.01); *H01L 29/785* (2013.01)

(58) Field of Classification Search
CPC ............ H01L 29/785; H01L 29/41791; H01L 29/66795
See application file for complete search history.

(56) References Cited

U.S. PATENT DOCUMENTS 8,772,109 B2 7/2014 Colinge
8,785,285 B2 7/2014 Tsai et al.
(Continued)

OTHER PUBLICATIONS

Liu et al., "A New Source/Drain Germanium-Enrichment Process Comprising Ge Deposition and Laser-Induced Local Melting and Recrystallization for P-FET Performance Enhancement", IEEE (2008): pp. 26-27. (Year: 2008).*

*Primary Examiner* — Michele Fan
(74) *Attorney, Agent, or Firm* — Haynes and Boone, LLP

(57) ABSTRACT

A method includes forming an epitaxial source/drain (S/D) feature over a semiconductor layer, where the epitaxial S/D feature includes silicon (Si) and germanium (Ge), forming a trench to expose a portion of the epitaxial S/D feature, annealing the exposed portion of the epitaxial S/D feature, where the annealing forms at a top surface of the epitaxial S/D feature a first region having a first Ge concentration and a second region disposed below the first region having a second Ge concentration that is less than the first Ge concentration, oxidizing the first region, removing the oxidized first region, and forming an S/D contact in the trench over the second region.

20 Claims, 10 Drawing Sheets

(51) Int. Cl.
  *H01L 29/78* (2006.01)
  *H01L 21/268* (2006.01)
  *H01L 21/311* (2006.01)
  *H01L 21/02* (2006.01)
  *H01L 29/40* (2006.01)
  *H01L 21/225* (2006.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,508,597 B1* | 11/2016 | Liu | H01L 29/7391 |
| 9,520,482 B1 | 12/2016 | Chang et al. | |
| 9,576,814 B2 | 2/2017 | Wu et al. | |
| 2017/0062579 A1* | 3/2017 | Xiong | H01L 21/82381 |
| 2020/0013900 A1* | 1/2020 | Carr | H01L 29/66545 |

* cited by examiner

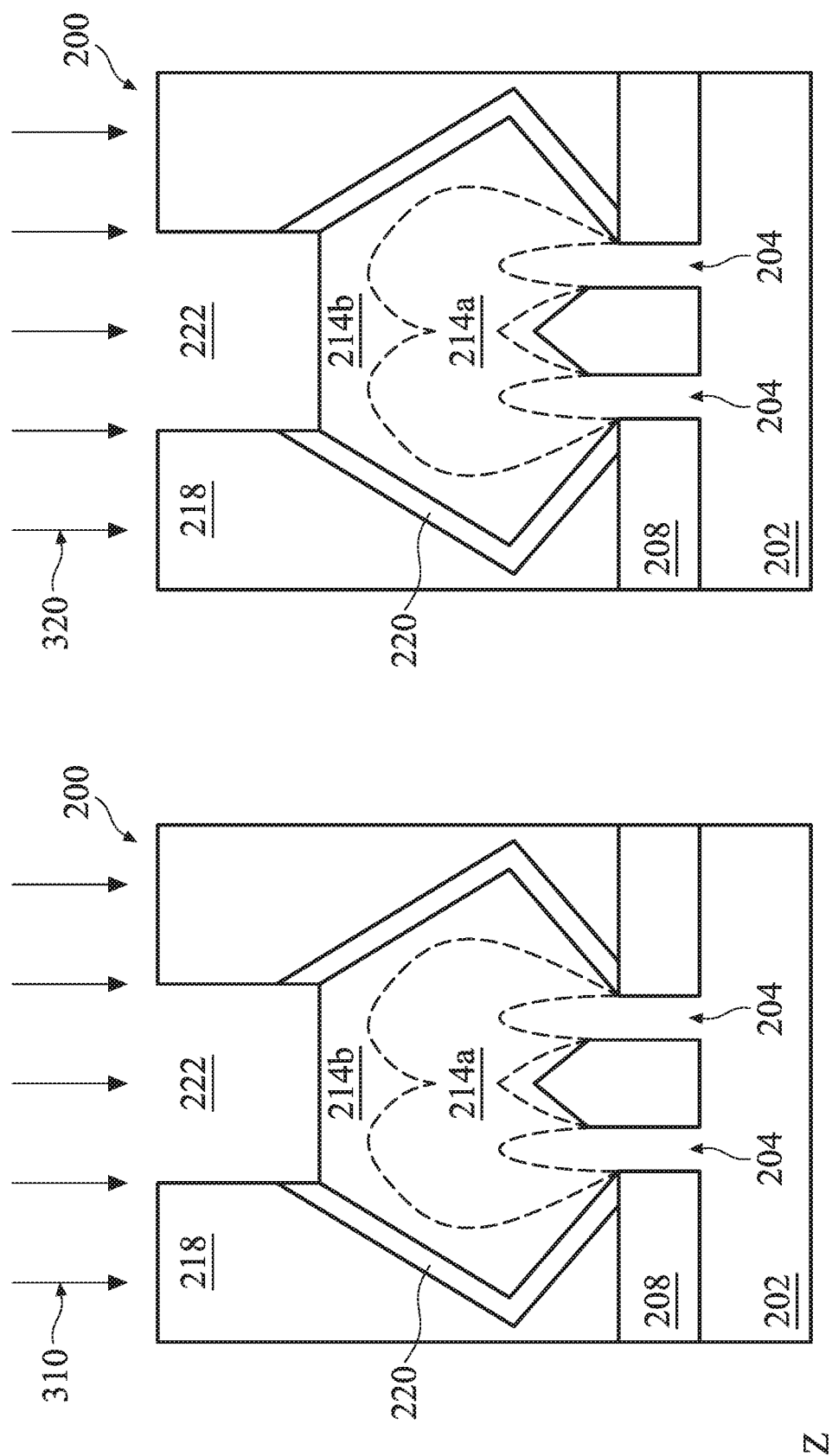

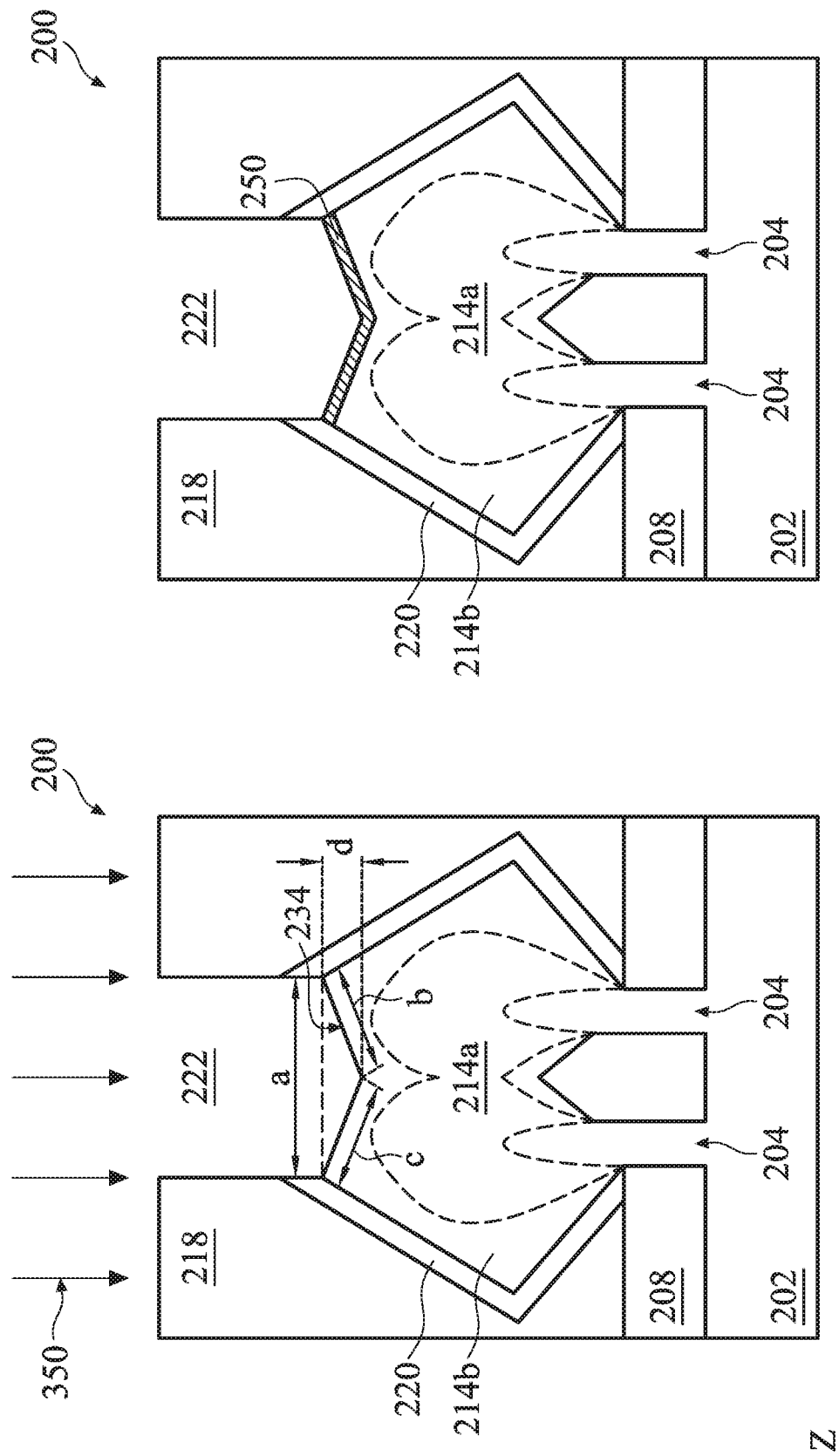

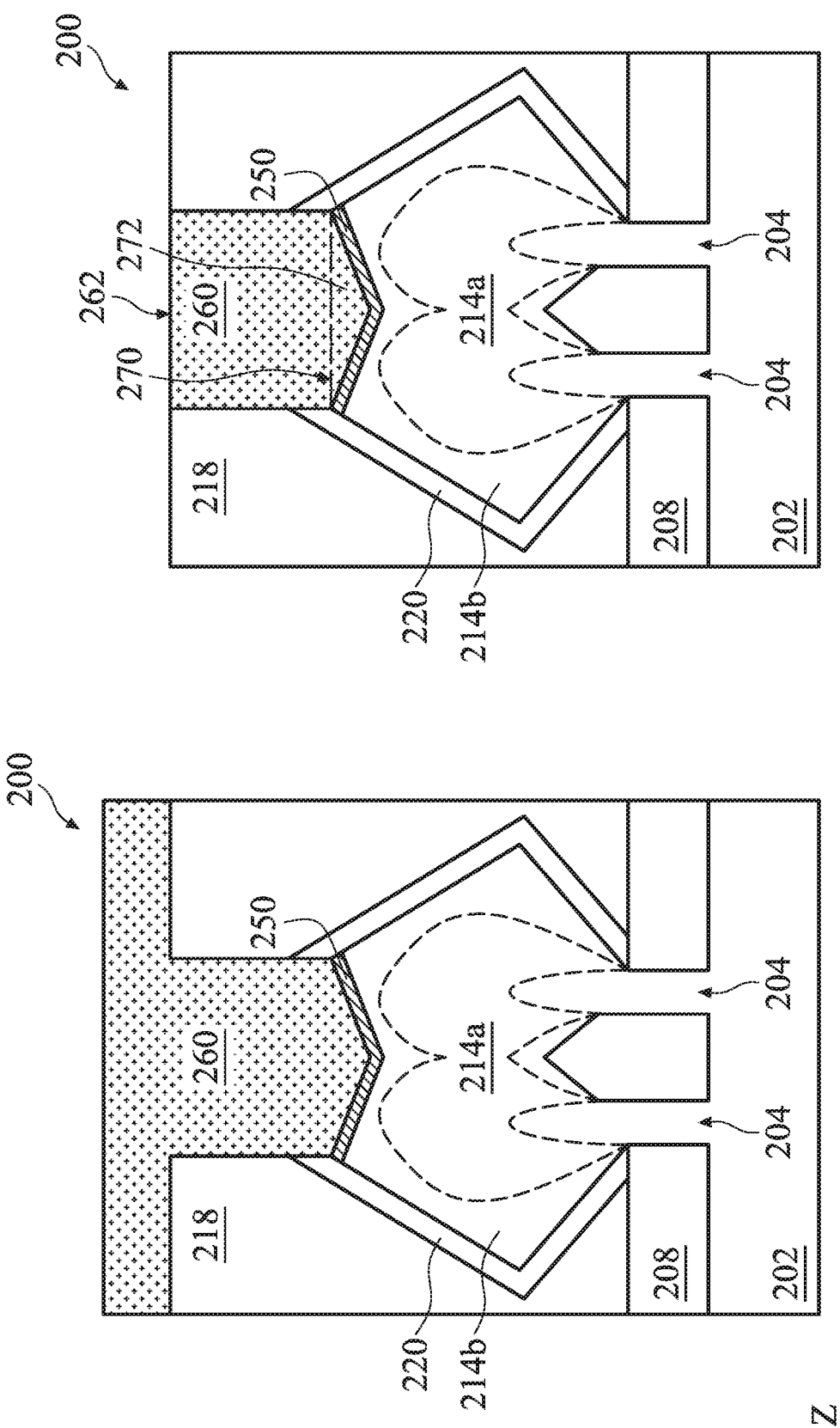

METHODS OF FORMING EPITAXIAL SOURCE/DRAIN FEATURES IN SEMICONDUCTOR DEVICES

CROSS-REFERENCE TO RELATED APPLICATIONS

This application claims priority to U.S. Provisional Patent Application Ser. No. 62/725,462 filed on Aug. 31, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of source/drain (S/D) contacts becomes more challenging as feature sizes continue to decrease. In particular, it remains a main object of semiconductor device fabrication to reduce contact resistance between an S/D feature and a subsequently formed S/D contact thereover. While current methods of forming S/D contacts are generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 9, 10, 11, 12, 13, 14, 15, 16, and 17 are cross-sectional views of an embodiment of the semiconductor device of FIG. 2 along line AA' during intermediate steps of an embodiment of the method of FIG. 1 according to various aspects of the present disclosure.

DETAILED DESCRIPTION

Figure 1:
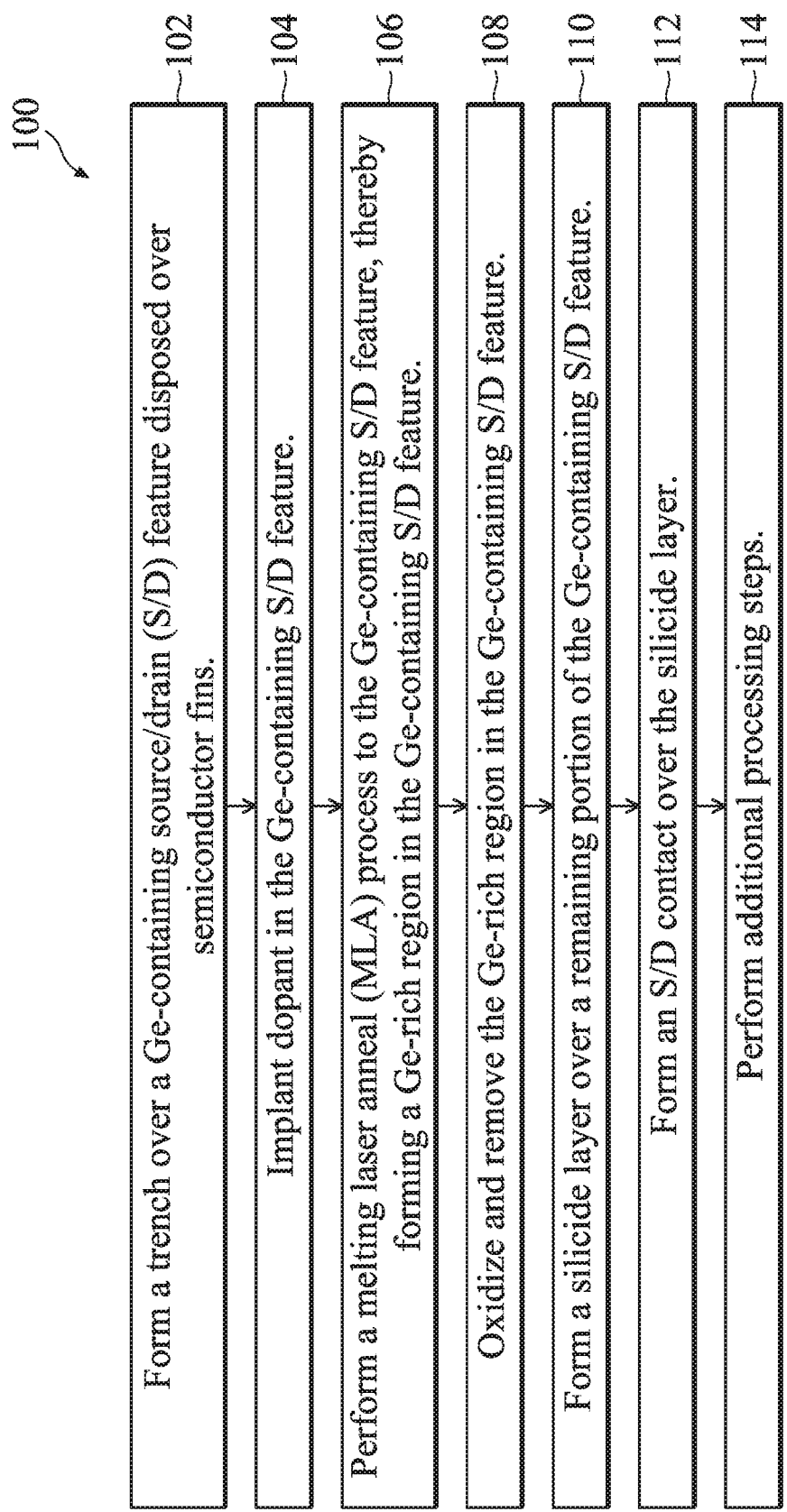
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-like FETs (FinFETs). It is an objective of the present disclosure to provide methods of forming source/drain contacts over p-type epitaxial source/drain features in FETs.

In FET fabrication, source/drain (S/D) contacts are generally formed to connect device-level S/D features (e.g., p-type epitaxial S/D features) with interconnect features such as vias. When forming S/D contacts over S/D features, it is oftentimes desirable to enlarge a contact area between the S/D contacts and the S/D features by forming a recessed profile in portions of the S/D features in contact with the S/D contacts. Generally, a recessed profile may be formed by controlling the growth of epitaxial layer(s) and/or etching the epitaxial layer(s) after it has been formed. While these methods have been generally adequate, they have not been entirely satisfactory in all aspects and may, for example, result in non-uniform feature sizes and even damages to the S/D features. For these and other reasons, improvements in methods of enlarging the contact area between S/D features, especially p-type epitaxial S/D features, and S/D contacts are desired for fabricating FETs with enhanced properties.

Figure 2:
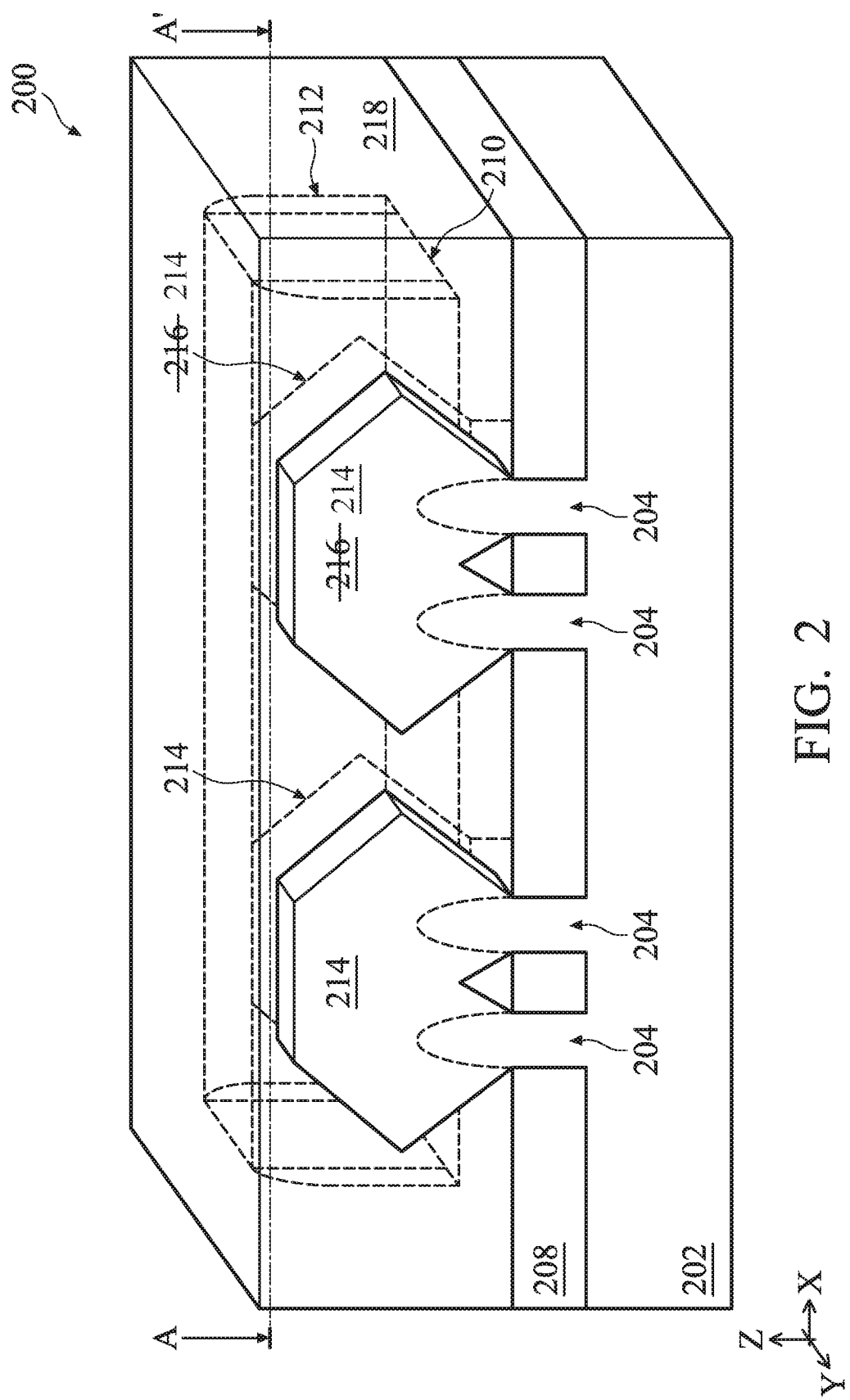
FIG. 2 is a perspective view of an embodiment of a semiconductor device according to various aspects of the present disclosure.

FIG. 1 illustrates a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-14, which illustrate a portion of the semiconductor device 200 during intermediate steps of the method 100. FIGS. 3-14 are cross-sectional views of the device 200 taken along dashed line AA' through an S/D region of fins 204 as illustrated in FIG. 2. For purposes of simplicity, only one S/D feature 214 is illustrated in FIGS. 3-14. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
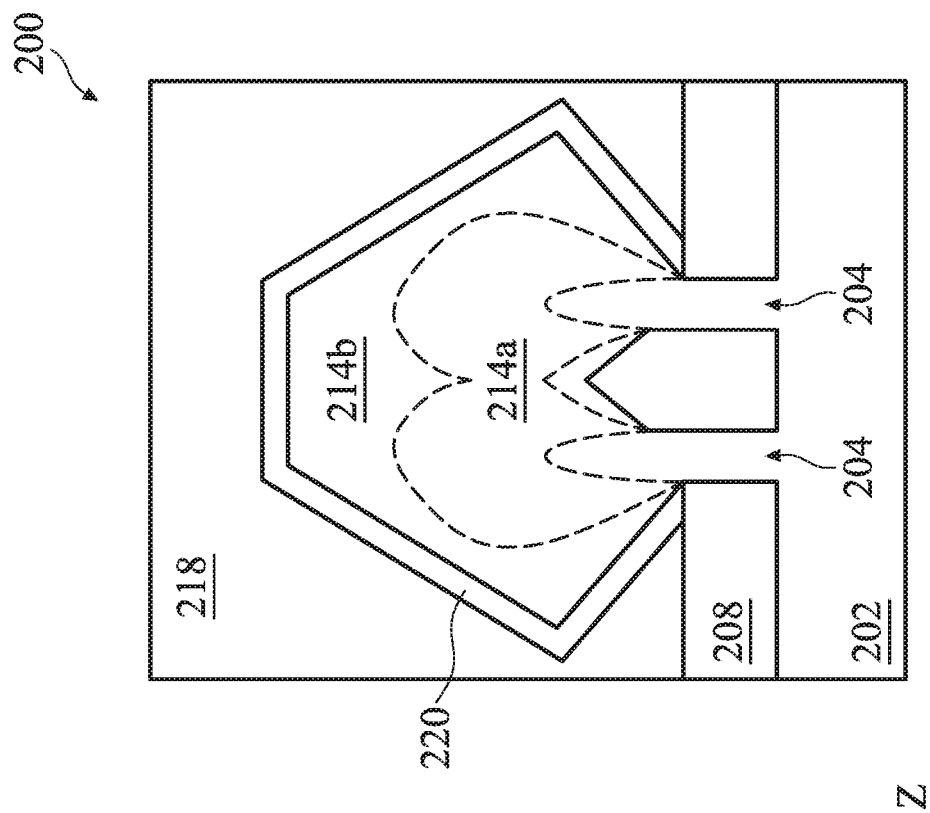

At operation 102, referring to FIGS. 1-3, the method 100 provides, or is provided with, the device 200 including a substrate 202 having semiconductor layers 204 (hereafter referred to as fins 204) disposed thereover, where two of the fins 204 are merged by an S/D feature 214. The device 200 further includes a high-k metal gate (HKMG) structure 210 disposed over channel regions of the fins 204, gate spacers 212 formed on sidewalls of the HKMG structure 210, isolation structures 208 disposed over the substrate 202 separating various components of the device 200, and an interlayer dielectric (ILD) layer 218 disposed over the isolation structures 208 and the S/D features 214.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2-3, the fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2-3, the device 200 includes S/D features 214 disposed over the fins 204. In many embodiments, each of the S/D features 214 merges two fins 204 together. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 may be suitable for forming a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant. In the present embodiments, at least one of the S/D features 214 includes a p-type epitaxial semiconductor material, e.g., epi SiGe doped with boron. Though not depicted, the device 200 may include additional p-type and/or n-type FETs. Of course, this configuration is for illustrative purposes only and is not intended to be limiting.

Referring to FIG. 3, the S/D features 214 may include multiple epitaxial semiconductor material layers, e.g., layer 214a and layer 214b. In many embodiments, the layer 214a is disposed over and thereby merging together two fins 204, while the layer 214b is disposed over and encapsulating the layer 214a. In the present embodiments, the layers 214a and 214b both include epitaxial SiGe but differ in the amounts of Ge included. In the depicted embodiment, the layer 214a includes less Ge than the layer 214b. For example, the layer 214b may include at least twice as much Ge as the layer 214a. Though not depicted, the S/D features 214 may include additional epitaxial semiconductor material layers. Furthermore, the S/D features 214 may include a dielectric layer 220 (hereafter referred to as a contact-etch stop layer, or CESL, 220) disposed over and wrapping around the layer 214b. The CESL 220 may comprise silicon nitride, silicon oxynitride, silicon nitride with oxygen or carbon elements, other suitable materials, or combinations thereof, and may be formed by CVD, physical vapor deposition (PVD), atomic layer deposition (ALD), other suitable methods, or combinations thereof.

The device 200 further includes the HKMG structure 210 disposed over the channel regions of the fins 204, such that it interposes S/D features 214. The HKMG structure 210 includes a high-k (i.e., having a dielectric constant greater than that of silicon oxide, which is approximately 3.9) dielectric layer (not depicted) disposed over the fins 204 and a metal gate electrode (not depicted) disposed over the high-k dielectric layer. The metal gate electrode may further include at least one work function metal layer and a bulk conductive layer disposed over the work function metal layer. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable n-type work function materials, or combinations thereof. The HKMG structure 210 may include work function metal layers of the same type (e.g., all n-type or all p-type) or of different types. The bulk conductive layer may include cobalt (Co), copper (Cu), tungsten (W), aluminum (Al), ruthenium (Ru), other suitable materials, or combinations thereof. The HKMG structure 210 may further include numerous other layers (not depicted), such as an interfacial layer disposed between the fins 204 and the high-k dielectric layer, hard mask layers, capping layers, barrier layers, other suitable layers, or combinations thereof. Various layers of the HKMG structure 210 may be deposited by any suitable method, such as chemical oxidation, thermal oxidation, ALD, CVD, PVD, plating, other suitable methods, or combinations thereof. A polishing process, such as chemical mechanical polishing (CMP), may be performed to remove excess materials from a top surface of the HKMG structure 210 to planarize a top surface of the device 200.

The device 200 further includes gate spacers 212 disposed on sidewalls of the HKMG structure 210. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure. The gate spacers 212 may be formed by first depositing a blanket of spacer material over the device 200, and then performing an anisotropic etching process to remove portions of the spacer material to form the gate spacers 212 on sidewalls of the HKMG structure 210.

In many embodiments, the HKMG structure 210 is formed after other components of the device 200 (e.g., the S/D features 214) are fabricated. Such process is generally referred to as a gate replacement process, which includes forming a dummy gate structure (not depicted) as a placeholder for the HKMG structure 210, forming the S/D features 214, forming the ILD layer 218 and the CESL 220 over the dummy gate structure and the S/D features 214, planarizing the ILD layer 218 by, for example, CMP, to expose a top surface of the dummy gate structure, removing the dummy gate structure in the ILD layer 218 to form a trench that exposes a channel region of the fins 204, and forming the HKMG structure 210 in the trench to complete the gate replacement process. In some embodiments, the ILD layer 218 includes a dielectric material, such as a low-k dielectric material, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the ILD layer 218 includes an oxide-containing dielectric material. The ILD layer 218 may include a multi-layer structure having multiple dielectric materials and may be formed by a deposition process such as, for example, CVD, FCVD, SOG, other suitable methods, or combinations thereof.

Figure 4:
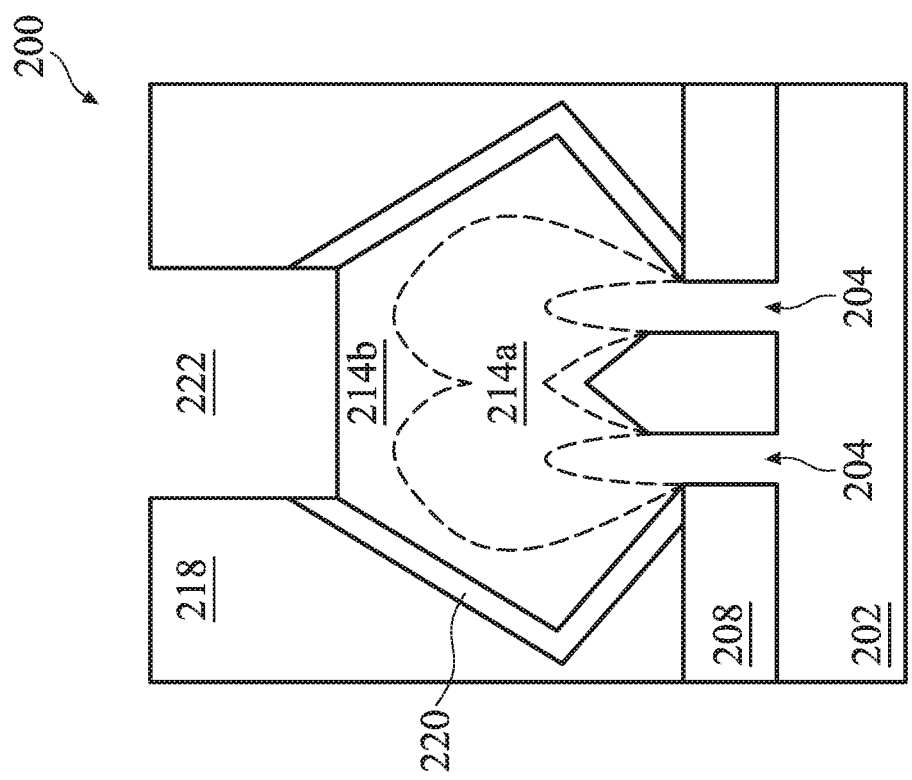

Now referring to FIG. 4, the method 100 at operation 102 forms a trench 222 in the ILD layer 218 over the S/D features 214. Specifically, the method 100 forms the trench 222 by performing a series of patterning and etching processes. In an example embodiment, the series of patterning and etching processes includes forming a masking element (not shown) including a resist (e.g., photoresist) layer configured to be patterned by a lithography process over the ILD layer 218 to expose portions of the ILD layer 218 and the CESL 220 to be etched, and subsequently etching the ILD layer 218 and the CESL 220 in a dry etching, wet etching, reactive ion etching (RIE), other suitable etching processes, or combinations thereof to expose the S/D features 214 in the trench 222. In some embodiments, the etching process is a dry etching process that employs one or more etchant, such as a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, an oxygen-containing gas (e.g., $O_2$), a nitrogen-containing gas (e.g., $N_2$), helium, argon, other suitable gases, or combinations thereof. After performing the etching process, the masking element is removed by any suitable method, such as plasma ashing or resist stripping.

At operation 104, referring to FIG. 5, the method 100 optionally implants dopant in the S/D feature 214 in an implantation process 310. In the present embodiments, because the S/D features 214 are p-type epitaxial S/D features, the dopant implanted at operation 104 is a p-type dopant such as, for example, boron. The method 100 may implant the dopant at operation 104 in two steps. First, the method 100 may bombard portions of the S/D features 214 (e.g., the layer 214b) exposed by the trench 222 with Ge atoms to amorphize a surface region of the layer 214b. Second, the method 100 implants the dopant (e.g., boron) in the amorphized surface region in a process similar to that discussed above with respect to forming the S/D features 214. Notably, the dopant in the surface region of the layer 214b, once activated, may help improve conductivity and lower resistance between the S/D features 214 and the subsequently formed S/D contacts. The dopant implanted at operation 104 may be activated by the subsequently applied annealing process as discussed in detail below.

At operation 106, referring to FIG. 6, the method 100 performs an annealing process 320 to the S/D features 214. The annealing process 320 may be performed by any suitable method, such as melting laser anneal (MLA), rapid thermal anneal (RTA), spike anneal (e.g., dynamic spike anneal, or DSA), other suitable methods, or combinations thereof. In the present disclosure, the annealing process 320 is implemented by MLA. MLA, as its name suggests, imparts sufficient thermal energy (from a laser source, for example) to a target layer (e.g., the layer 214b of the S/D features 214) such that the target layer rapidly undergoes phase change from solid to liquid. Stated differently, MLA is configured to rapidly heat at least a portion of the layer 214b to above its melting temperature. Due to its rapid nature, the annealing depth and annealing time of MLA is significantly less than other annealing methods including RTA and DSA. In one example, the annealing depth of MLA may be from about $10^{-5}$ to about $10^{-4}$ the annealing depth of RTA, and the annealing time of MLA may be as little as about $10^{-7}$ the annealing time of RTA. In another example, the annealing depth of MLA may be from about $10^{-4}$ to about $10^{-3}$ the annealing depth of DSA, and the annealing time of MLA may be as little as about $10^{-5}$ to about $10^{-3}$ the annealing time of DSA. Because of its shallow annealing depth, MLA may be configured to selectively anneal only a surface portion of a substrate (e.g., less than about the topmost 5 nm of the substrate's thickness), thereby reducing potential thermal damage imparted to other portions of the device 200 (e.g., the HKMG structure 210) during the annealing process 320.

In many embodiments, MLA may be controlled by adjusting the energy and/or the time of the anneal to achieve a desired annealing depth. In the present disclosure, a desired annealing depth of MLA may be from about 10 nm to about 100 nm, and the annealing time may be less than about 0.2 µs (e.g., about 160 ns). On one hand, if the annealing time is too long, excessive thermal energy may damage the HKMG (e.g., by unintentionally shifting the threshold energy of the HKMG). On the other hand, if the annealing time is too short, the desired annealing results would be compromised. In some examples, a range of the energy of the MLA may be from about 0.48 $J/cm^2$ to about 0.5 $J/cm^2$. Notably, if the energy is above such range, the epitaxial structure of the S/D feature 214 may suffer damages such as melting. On the other hand, if the energy is below such range, the desired annealing results may be compromised.

Figure 7:
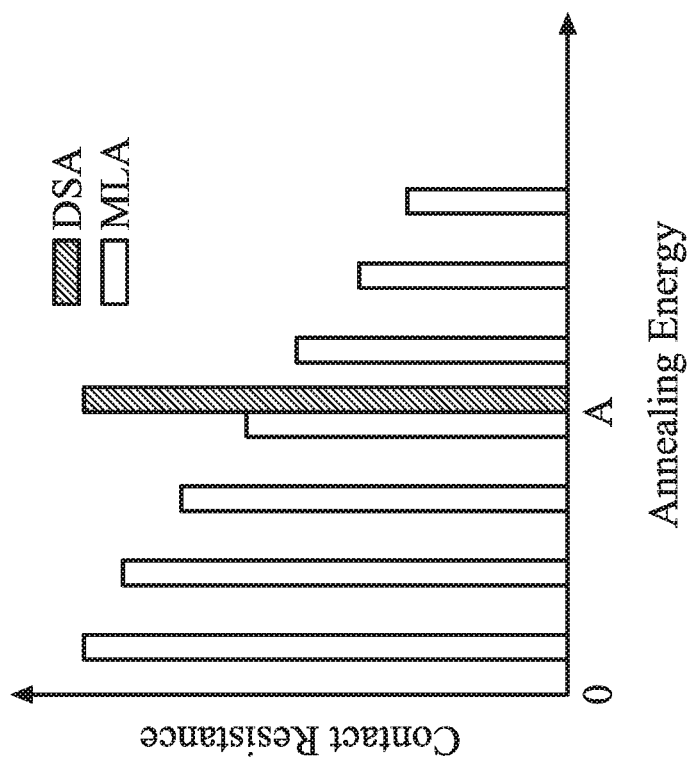
FIG. 7 is a schematic illustration of a relationship between annealing energy and contact resistance of the device of FIG. 2 according to various aspects of the present disclosure.

As discussed above, MLA is configured to rapidly heat the layer 214b to at least its melting temperature. Specifically, MLA may be configured to heat a portion of the layer 214b of the S/D features 214 exposed by the trench 222 to above the melting temperature of SiGe included in the S/D features 214, which is about 1072 degrees Celsius. In an example embodiment, MLA may heat the exposed portion of the layer 214b to about 1200 degrees Celsius. In some embodiments, the layer 214b, having a greater concentration of Ge, has a lower melting temperature than the layer 214a, which includes less Ge by comparison. Thus, the annealing process 320 selectively melts the layer 214b while the layer 214a is not melted or substantially melted by the MLA. In many embodiments, the rapid melting of the exposed portion of the layer 214b activates and increases solubility of the p-type dopants (e.g., boron) in SiGe, resulting in improved dopant activation and device performance. Notably, other annealing methods such as RTA and DSA are not capable of heating a substrate to this temperature range. Referring to FIG. 7, for example, increased MLA energy (i.e., temperature of the applied laser) leads to decreased contact resistance, thus increased device performance. Furthermore, because MLA may be operated at a much higher temperature than DSA, the resulting contact resistance may be significantly reduced in comparison (e.g., compare the contact resistance achieved by MLA at energy level "A" with the baseline value achieved by DSA at a similar energy level) as depicted schematically in FIG. 7.

Figure 8:
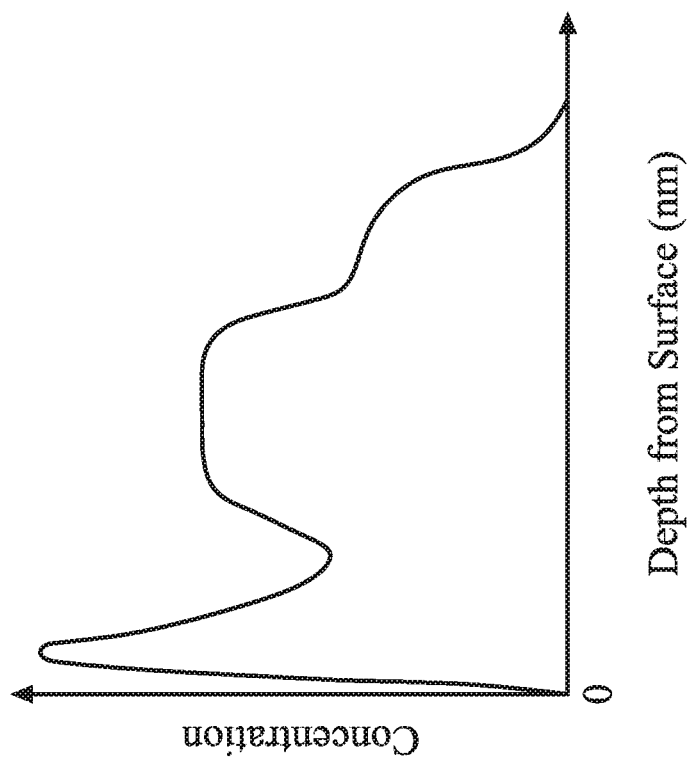
FIG. 8 is a schematic illustration of a relationship between a depth measured from a surface of the device 200 and a concentration of germanium according to various aspects of the present disclosure.
Figure 9:
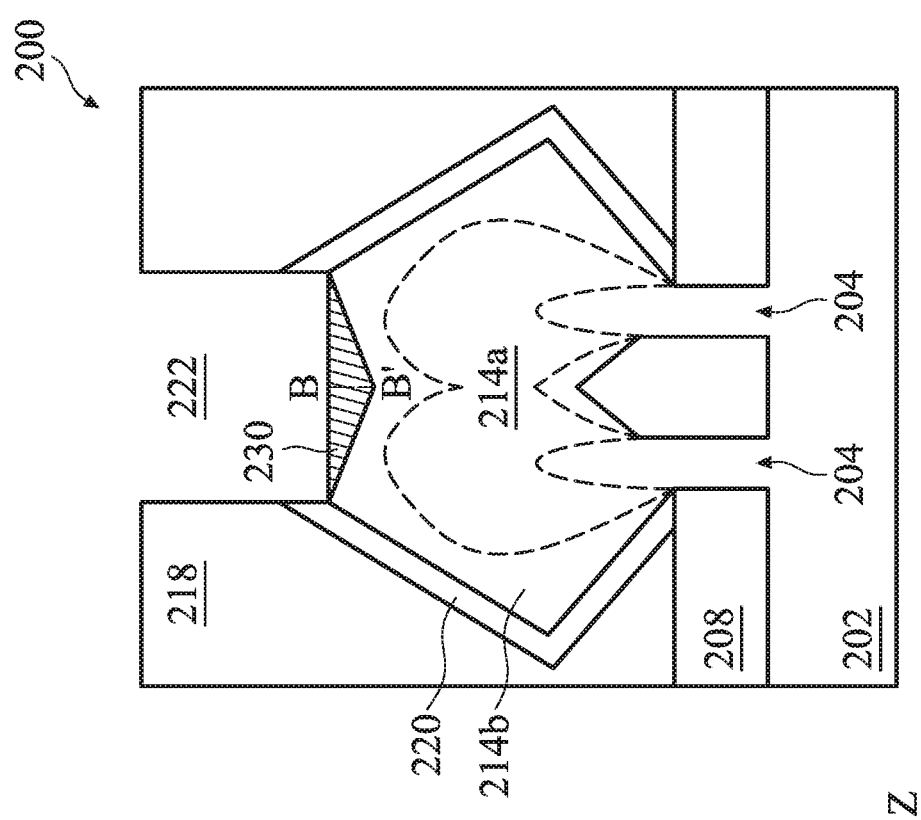
Figure 12:
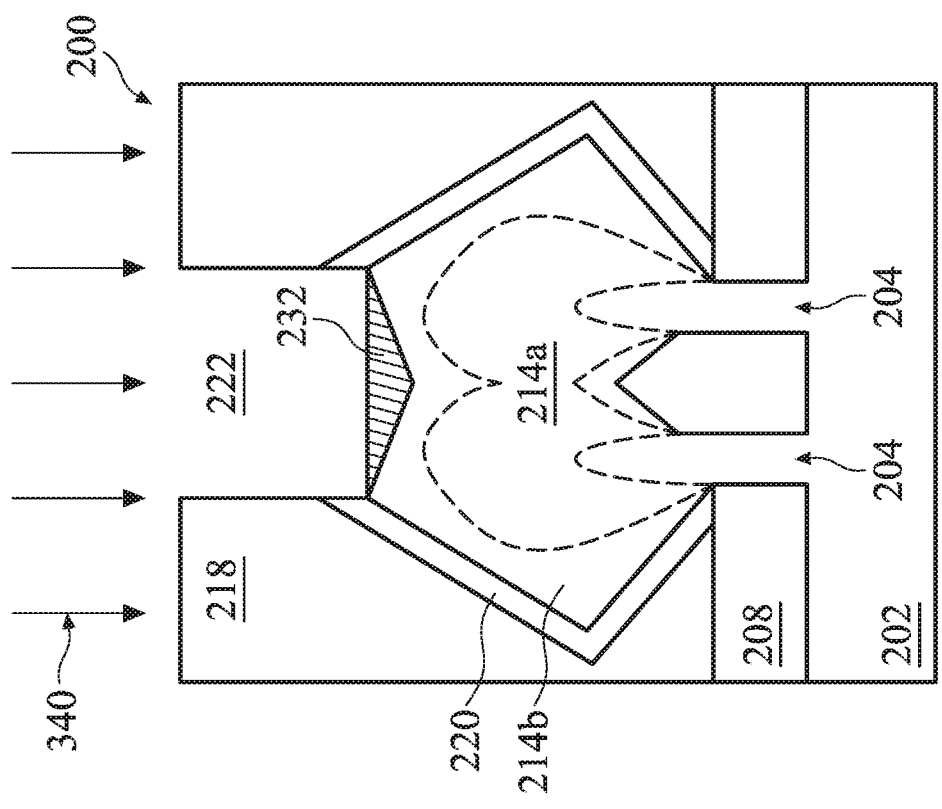

Referring to FIG. 9, after the implementation of MLA at the annealing process 320, melted SiGe re-solidifies (or re-crystallizes) as temperature drops to below its melting point. Ge atoms within the layer 214b rearrange themselves such that a concentration of Ge atoms at a surface region 230 of the layer 214b is greater than a concentration of Ge atoms in a region disposed below the surface region 230. In other words, as SiGe re-crystallizes, Ge atoms pile up in the surface region 230. In the present disclosure, the surface region 230 is generally an inverted triangular shape whose depth at its centerline BB' is greater than its depth on either side of the centerline BB'. Of course, the present disclosure is not limited to this configuration. For example, the surface region 230 may have curved edges and/or corners rather than straight edges as depicted herein. In another example, a profile of the surface region 230 may follow a profile of the top portion of the layer 214a. In an example embodiment, the greatest depth of the surface region 230 (i.e., measured along the centerline BB') may be about 5 nm. Notably, because pile up of Ge atoms substantially occurs within the layer 214b and not the layer 214a, the profile of the surface region 230 is defined by its proximity to the layer 214a. For example, the portion of the surface region 230 along the centerline BB' extends out due to the presence of the portion of the layer 214b surrounded by the layer 214a. In the present disclosure, the concentration of Ge in the surface region 230 may be at least about 65% of Ge (in comparison, a concentration of Ge in the surface region 230 after applying the DSA, a baseline treatment, would be no more than about 55%) and gradually decreases in regions below the surface region 230. An example concentration profile of Ge in the layer 214b is depicted in FIG. 8, which shows that the concentration of Ge is greatest within the top few nanometers (e.g., less than 5 nm) of the surface of the layer 214b. As will be discussed in detail below, such differentiation in Ge concentration may promote the formation of a recessed profile in the layer 214b, thereby increasing the contact area between the S/D features 214 and the subsequently formed S/D contacts. In many embodiments, a size of the surface region 230 is controlled by the energy of the MLA applied during the annealing process 320. Specifically, the size of the surface region 230 may increase as the energy of the MLA increases.

Figure 10:
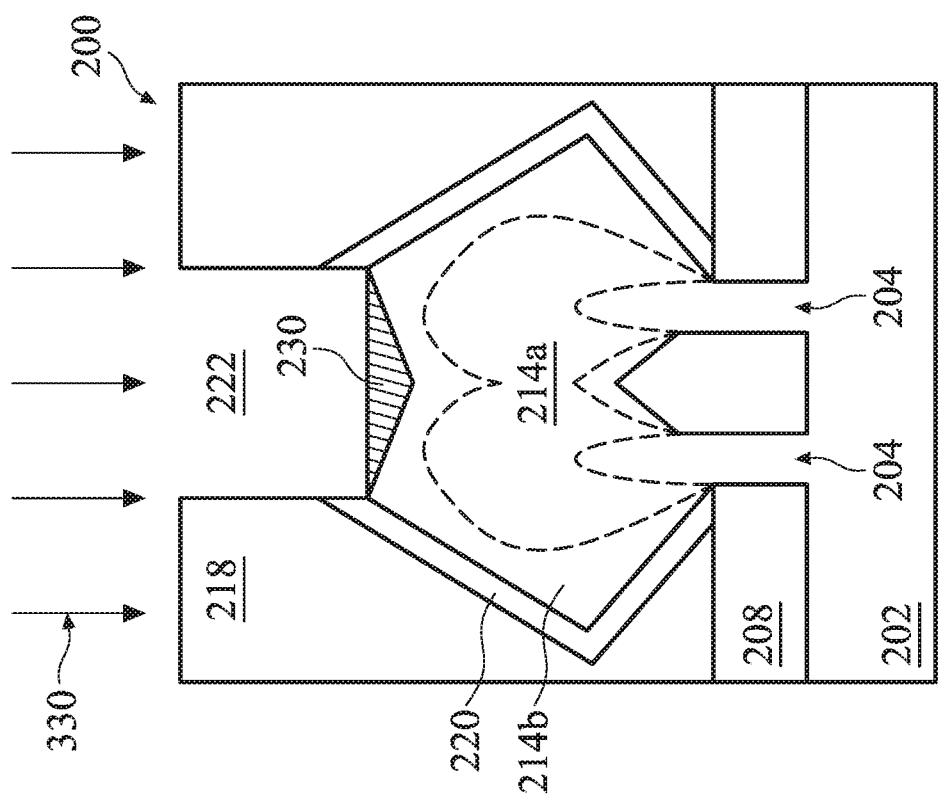

Though not required, the method 100 at operation 106 may perform an additional annealing process 330 after performing the annealing process 320. Referring to FIG. 10, the annealing process 330 implements an annealing method that is configured to operate at a lower temperature than that of MLA. In some embodiments, the annealing process 330 is implemented by DSA, which is operable to activate p-type dopants in the regions below the surface region 230. In many embodiments, because the annealing process 330 is implemented at a temperature lower than that of MLA, it does not affect the concentration of Ge in the surface region 230. In other words, DSA does not provide sufficient energy for Ge atoms to rearrange themselves and change the concentration distribution of Ge atoms in the layer 214b.

At operation 108, the method 100 oxidizes SiGe in the surface region 230 to form an oxidized region 232. Specifically, referring to FIG. 11, the method 100 first deposits a spacer layer 240 over the device 200. The spacer layer 240 may include any suitable dielectric material, such as silicon nitride, and may be deposited by any suitable method, such as CVD, ALD, PVD, other suitable methods, or combinations thereof. Though not depicted in the cross-sectional view of FIG. 11, the spacer layer 240 provides electrical isolation between the subsequently formed S/D contact and a neighboring HKMG structure 210. Thereafter, referring to FIG. 12, portions of the spacer layer 240 are removed by an etching process 340, such that portions of the spacer layer 240 remain on sidewall surfaces of the trench 222 between the S/D features 214 and the HKMG structure 210 (not depicted in the cross-sectional view of FIG. 12). The etching process 340 may include multiple steps. For example, the etching process 340 includes first performing an anisotropic dry etching process to remove portions of the spacer layer 240, followed by a plasma ashing process (e.g., a dry etching process) to remove any etching byproduct and lastly a wet etching process to remove any remaining polymeric residue. In the present disclosure, the wet etching process may be implemented using an oxidizing etchant, such as ozone-deionized water ($DIO_3$), which is ozone dissolved in DI water (hence $DIO_3$ is considered an aqueous oxidizing etchant). In many embodiments, the oxidizing etchant $DIO_3$ is configured to remove any remaining organic (or polymeric) etching residue from the device 200 and oxidize SiGe in the surface region 230 to form germanium oxide and silicon oxide, thereby transforming the surface region 230 to an oxidized region 232. Notably, the oxidizing etchant $DIO_3$ is operable to selectively oxidize regions (e.g., the surface region 230) where Ge concentration is above about 65%, while the portions of the S/D feature 214 disposed below the surface region 230 (including portions of both the layers 214a and 214b) are not oxidized or only minimally oxidized by the oxidizing etchant $DIO_3$. Of course, other oxidizing etchants may also be applicable for oxidizing SiGe in the surface region 230. Because germanium oxide is soluble in water (or aqueous solutions), the oxidizing etchant $DIO_3$ may also remove a portion of the germanium oxide formed during the etching process 340. As a result, at least a portion of the surface region 230 with a high Ge content is removed or substantially removed by the oxidation process during the etching of the spacer layer 240.

Figure 11:
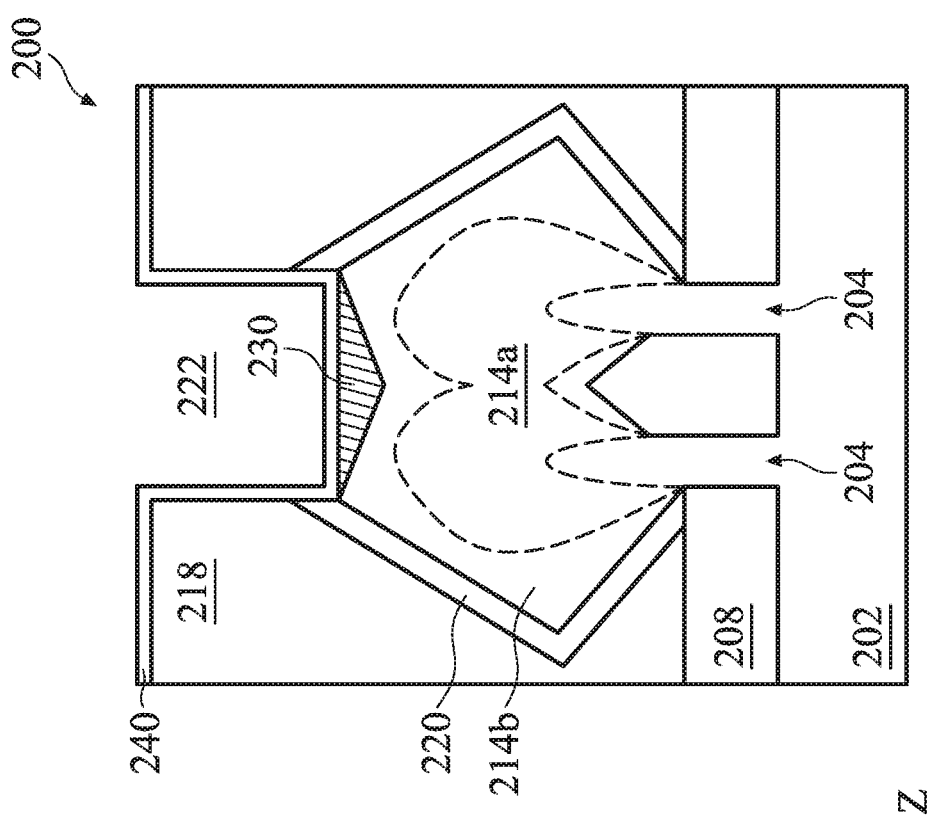

At operation 110, referring to FIGS. 13 and 14, the method 100 forms a silicide layer 250 over the S/D features 214, i.e., over the layer 214b, in the trench 222. Referring to FIG. 11, the method 100 first performs a pre-cleaning process 350 to the device 200 in preparation for forming the silicide layer 250. The pre-cleaning process 350 may be a dry etching process, a wet etching process, RIE, other suitable processes, or combinations thereof. In the present embodiment, the pre-cleaning process 350 is an anisotropic dry etching process configured to remove any oxide-like layer present on the exposed portion of the layer 214b. In one example, the pre-cleaning process may be implemented using a fluorine-containing gas, an argon-containing gas, other suitable gases, or combinations thereof. In many embodiments, the pre-cleaning process 350 selectively removes remaining portions of the oxidized region 232, which includes silicon oxide and/or any remaining germanium oxide, to form a recessed profile 234, while other components of the device 200 (e.g., the ILD layer 218, the CESL 220, regions below the oxidized region 232) are not etched or only minimally etched.

As discussed above, because the layer 214b has a lower melting temperature than the layer 214a, the MLA applied at operation 106 preferentially melts regions of the layer 214b, leading to a downward recessed profile 234 as depicted in FIG. 13. In some examples, the recessed profile 234 may be defined by four parameters a, b, c, and d where, in some examples, a is a distance measured across a top surface of the layer 214 as shown in FIG. 13, b and c are surfaces slanted downward toward each other, and d is a distance measured from a highest point along a to a lowest point of the profile 234. In other words, b and c are configured to form an angle therebetween, such that a portion of the recessed profile 234 slants downward toward the fins 204. Though depicted to be approximately an inverted isosceles triangle, the recessed profile 234 is not limited to any this specific geometric shape in the present disclosure, nor are a, b, c, and d limited to any specific values so long as the recessed profile 234 does not expose the underlying layer 214a. In some examples, b and c may not be equal in length. In some examples, b and c may be curved surfaces rather than straight surfaces as seen in the perspective of FIG. 13. In other examples, a ratio of d to a may be about $8/13$ to about $2/3$. It is important to note, however, that due to the application of MLA, the concentration of Ge atoms in the surface region 230 may be distributed in such a way that the highest amount of Ge is found at a lowest portion of the recessed profile 234 (i.e., where b meets c), forming an approximate inverted triangular shape as depicted herein. Other annealing methods, such as DSA, would yield an approximate inverted trapezoidal profile in which b and c do not meet directly but are connected by another surface.

Now referring to FIG. 14, the method 100 at operation 110 proceeds to forming the silicide layer 250 in the recessed profile 234. In many embodiments, the silicide layer 250 includes a metal silicide, such as nickel silicide, cobalt silicide, tungsten silicide, tantalum silicide, titanium silicide, platinum silicide, erbium silicide, palladium silicide, other suitable silicide, or combinations thereof. The silicide layer 250 may be formed by a deposition process such as CVD, ALD, PVD, other suitable processes, or combinations thereof. For example, a metal layer (e.g., nickel) may be deposited over the S/D features 214 (e.g., the layer 214b). Then, the device 200 is annealed to allow the metal layer and the semiconductor materials of the S/D features 214 to react. Thereafter, the un-reacted metal layer is removed, leaving the silicide layer 250 over the S/D features 214. Alternatively, the silicide layer 250 may be directly formed over the layer 214b by any suitable deposition method, such as CVD, ALD, PVD, other suitable methods, or combinations thereof.

At operation 112, referring to FIGS. 15 and 16, the method 100 forms an S/D contact 262 over the S/D features 214. In many embodiments, the S/D contact 262 electrically connects the S/D features 214 to additional components of the device 200 formed afterwards, such as, for example, interconnect features (e.g., vias). Referring to FIG. 15, the method 100 at operation 112 deposits a conductive material 260 in the trench 222. The conductive material 260 may include any suitable material, such as tungsten, cobalt, ruthenium, copper, aluminum, titanium, nickel, platinum, palladium, other suitable conductive materials, or combinations thereof, and may be formed by any suitable method, such as CVD, ALD, PVD, plating, other suitable processes, or combinations thereof. Thereafter, referring to FIG. 16, the method 100 may remove excess conductive material 260 formed on the top surface of the ILD layer 218 in a planarization process (e.g., a CMP process) to form the S/D contact 262. Notably, as the shape of the recessed profile 234 angles downward toward the fins 204, a contact area between the S/D contact 262 and the S/D features 214 is enlarged compared to instances where the contact area assumes a substantially horizontal profile, indicated by the dotted line in FIG. 16. A size of the enlarged contact area 272 may be determined by the parameters of the MLA implemented during the annealing process 320 as discussed above. In some examples, the contact area may be enlarged by about 11% and the maximum depth (see parameter a in FIG. 13) may be lengthened by about 50% compared to instances when the fabrications steps discussed herein are not employed.

Figure 17:
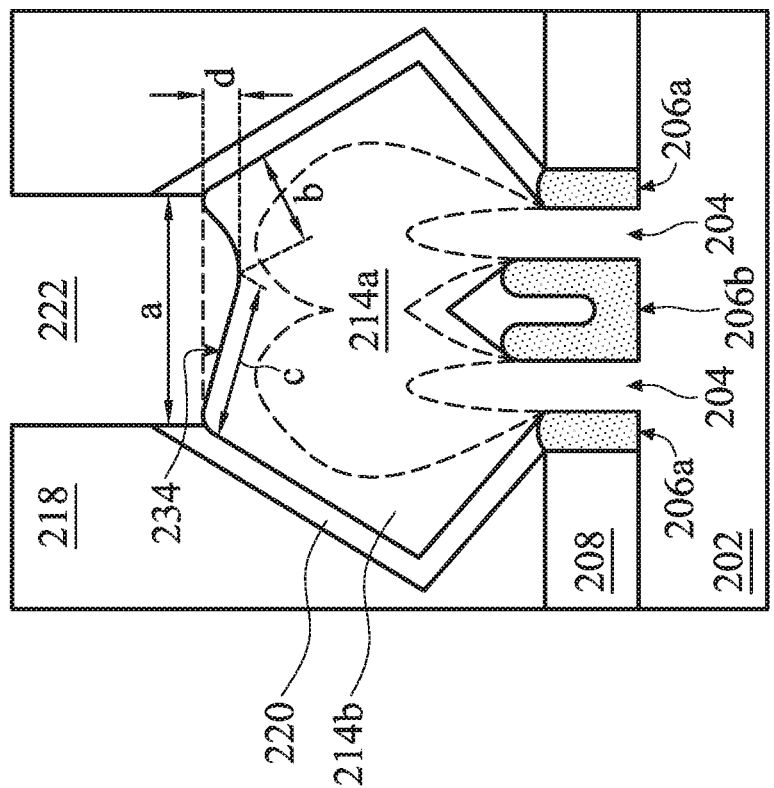

In some embodiments, referring to FIG. 17, other elements may also be included in the device 200. For example, spacers 206a and 206b may be provided along sidewalls of the fins 204 to facilitate fabrication of the layers 214a and/or 214b during an epitaxial growth process. The spacers 206a are disposed on outer sidewalls of the fins 204, while the spacers 206b are disposed on inner sidewalls of the fins 204. In some embodiments, the spacers 206a and 206b differ in height relative to the height of the fin 204. In some embodiments, as depicted herein, the spacers 206b may be physically connected. Additionally, as discussed above, the recessed profile 234 may be described by parameters a, b, c, and d, where b and c may not be equal in length and one or both of b and c may be a curved edge instead of a straight edge. Similar to the discussion above with respect to operations 110 and 112, the method 100 may then proceed to form the silicide layer 250 over the recessed profile 234, deposit the conductive material 260 over the silicide layer 250, and perform a CMP process to form the S/D contact 262.

At operation 114, the method 100 may perform additional processing steps to the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

The present disclosure provides methods of forming S/D contacts in FETs. Embodiments of the present disclosure include forming a contact trench over a Ge-containing S/D feature, performing a melting laser anneal (MLA) process to the S/D feature exposed in the contact trench, thereby forming a Ge-rich region, oxidizing and removing the Ge-rich region from the S/D feature, forming a silicide layer over the remaining portion of the S/D feature, and forming an S/D contact over the silicide layer. In some embodiments, the method provided herein includes implanting a dopant in the S/D feature before performing the MLA process. In some embodiments, the MLA process is configured to selectively anneal portions of the S/D features to form the Ge-rich region at the surface of the S/D features. In some embodiments, oxidizing and removing the Ge-rich region includes applying various cleaning and etching agents to the Ge-rich region. In some embodiments, removing the Ge-rich region results in a recessed profile (e.g., a non-linear profile) in the top portion of the S/D feature.

Although not intended to be limiting, one or more embodiments of the present disclosure provide many benefits to a semiconductor device and the formation thereof. For example, the recessed profile formed in the top portion of the S/D feature enlarges a contact area between the S/D feature and a subsequently formed S/D contact, thereby reducing contact resistance of the device thus formed. Compared to methods of growing S/D features to a specific profile to accommodate formation of the S/D contact and/or directly etching S/D features to obtain a recessed profile, embodiments provided herein ensure that sizes of the S/D features are kept relatively uniform and that the S/D features may not be inadvertently over-etched causing damage to their structures and performance.

In one aspect, the present disclosure provides a method that includes forming an epitaxial S/D feature over a semiconductor layer, where the epitaxial S/D feature includes Si and Ge, forming a trench to expose a portion of the epitaxial S/D feature, and annealing the exposed portion of the epitaxial S/D feature, such that the annealing forms over a top surface of the epitaxial S/D feature a first region having a first Ge concentration and a second region disposed below the first region having a second Ge concentration that is less than the first Ge concentration. Thereafter, the method proceeds to oxidizing the first region, removing the oxidized first region, and forming an S/D contact in the trench over the second region.

In another aspect, the present disclosure provides a method that includes forming an epitaxial S/D feature over semiconductor fins, the epitaxial S/D feature including silicon and germanium, and then forming a recess in the epitaxial S/D feature. Specifically, forming the recess includes removing a portion of the epitaxial S/D feature to form a trench, performing an annealing process to a top portion of the epitaxial S/D feature exposed in the trench, oxidizing the top portion of the epitaxial S/D feature after performing the annealing process and forming a silicide layer over the epitaxial S/D feature. The method further includes forming an S/D contact over the silicide layer.

In yet another aspect, the present disclosure provides a semiconductor structure that includes semiconductor fins disposed over a substrate, and an epitaxial source/drain (S/D) feature disposed over the semiconductor fins, where a top surface of the epitaxial S/D feature includes two surfaces slanted downward toward each other at an angle. The semiconductor structure further includes a silicide layer disposed over the epitaxial S/D feature and an S/D contact disposed over the silicide layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an epitaxial source/drain (S/D) feature over a semiconductor layer, wherein the epitaxial S/D feature includes silicon (Si) and germanium (Ge);
   forming a trench to expose a portion of the epitaxial S/D feature;
   annealing the exposed portion of the epitaxial S/D feature, wherein the annealing forms over a top surface of the epitaxial S/D feature a first region having a first Ge concentration and a second region disposed below the first region having a second Ge concentration that is less than the first Ge concentration;
   oxidizing the first region;
   removing the oxidized first region; and
   forming an S/D contact in the trench over the second region.

2. The method of claim 1, wherein annealing the exposed portion of the epitaxial S/D feature includes performing a melting laser anneal process.

3. The method of claim 1, oxidizing the first region includes:
   depositing a dielectric layer in the trench;
   removing portions of the dielectric layer to form spacers; and
   performing a wet clean process to the spacers, wherein performing the wet clean process oxidizes the first region to form silicon oxide and germanium oxide.

4. The method of claim 3, wherein performing the wet clean process removes the germanium oxide.

5. The method of claim 3, wherein performing the wet clean process includes treating the epitaxial S/D feature with an oxidizing etchant.

6. The method of claim 1, wherein removing the oxidized first region includes performing an anisotropic dry etching process.

7. The method of claim 6, wherein performing the anisotropic dry etching process includes applying an etchant including a fluorine-containing gas, an argon-containing gas, or a combination thereof.

8. The method of claim 1, further comprising, after removing the oxidized first region and before forming the S/D contact, forming a silicide layer in the trench.

9. A method, comprising:
   forming an epitaxial source/drain (S/D) feature over semiconductor fins, wherein the epitaxial S/D feature includes silicon and germanium;
   forming a recess in the epitaxial S/D feature, wherein forming the recess includes:
      removing a portion of the epitaxial S/D feature to form a trench;
      performing an annealing process to a top portion of the epitaxial S/D feature exposed in the trench;
      after performing the annealing process, oxidizing the top portion of the epitaxial S/D feature; and
      forming a silicide layer over the epitaxial S/D feature, wherein forming the silicide layer removes the oxidized top portion of the epitaxial S/D feature to form the recess; and
   forming an S/D contact over the silicide layer.

10. The method of claim 9, wherein forming the epitaxial S/D feature merges the semiconductor fins together.

11. The method of claim 9, wherein forming the epitaxial S/D feature includes forming a first epitaxial layer over the semiconductor fins and forming a second epitaxial layer over the first epitaxial layer, wherein the second epitaxial layer includes a greater amount of germanium than the first epitaxial layer.

12. The method of claim 11, wherein performing the annealing process includes heating the top portion of the second epitaxial layer to above its melting temperature.

13. The method of claim 9, wherein performing the annealing process is implemented by a melting laser anneal process.

14. The method of claim 13, wherein oxidizing the top portion of the epitaxial S/D feature includes selectively oxidizing the top portion of the epitaxial S/D feature relative to a bottom portion disposed below the top portion.

15. The method of claim 13, wherein forming the silicide layer includes performing a pre-cleaning process to the epitaxial S/D feature, and wherein performing the pre-cleaning process selectively removes the top portion of the epitaxial S/D feature relative to a bottom portion disposed below the top portion.

16. The method of claim 9, wherein oxidizing the portion of the epitaxial S/D feature includes applying ozone to the portion of the epitaxial S/D feature.

17. A method, comprising:
   providing an epitaxial source/drain (S/D) feature over semiconductor fins, wherein the epitaxial S/D feature merges the semiconductor fins, and wherein the epitaxial S/D feature includes silicon germanium;
   forming a silicide layer over the epitaxial S/D feature, wherein forming the silicide layer includes:
      forming a trench in the epitaxial S/D feature;
      performing a melting laser anneal (MLA) to a first region of the epitaxial S/D feature exposed in the trench;
      oxidizing the first region of the epitaxial S/D feature; and
      forming the silicide layer over a second region of the epitaxial S/D feature disposed below the first region, wherein forming the silicide layer removes the oxidized first region; and
   forming an S/D contact over the silicide layer.

18. The method of claim 17, wherein performing the MLA melts the first region of the epitaxial S/D feature.

19. The method of claim 17, wherein oxidizing the first region of the epitaxial S/D feature includes applying an aqueous oxidizer.

20. The method of claim 17, wherein removing the oxidized first region includes etching the oxidized first region with an etchant including a fluorine-containing gas, an argon-containing gas, or a combination thereof.

* * * * *